United States Patent
Van Der Cammen (10) Patent No.: US 9,379,761 B2
(45) Date of Patent: Jun. 28, 2016

(54) IMPEDANCE MEASUREMENT SYSTEM AND MOBILE COMMUNICATION DEVICE COMPRISING AN IMPEDANCE MEASUREMENT SYSTEM

(71) Applicant: QUALCOMM Technologies, Inc., San Diego, CA (US)

(72) Inventor: Peter Van Der Cammen, Berkel en Rodenrijs (NL)

(73) Assignee: Qualcomm Technologies, Inc., San Diego, CA (US)

( * ) Notice: Subject to any disclaimer, the term of this patent is extended or adjusted under 35 U.S.C. 154(b) by 0 days.

(21) Appl. No.: 14/758,977

(22) PCT Filed: Jan. 11, 2013

(86) PCT No.: PCT/EP2013/050498
§ 371 (c)(1),
(2) Date: Jul. 2, 2015

(87) PCT Pub. No.: WO2014/108204
PCT Pub. Date: Jul. 17, 2014

(65) Prior Publication Data
US 2015/0349833 A1    Dec. 3, 2015

(51) Int. Cl.
*H04B 17/00* (2015.01)
*G01R 27/02* (2006.01)
*H04B 1/40* (2015.01)
*H04B 1/00* (2006.01)
*H04B 15/02* (2006.01)

(52) U.S. Cl.
CPC *H04B 1/40* (2013.01); *G01R 27/02* (2013.01); *H04B 1/0053* (2013.01); *H04B 15/02* (2013.01); *H04B 17/00* (2013.01)

(58) Field of Classification Search
CPC ........ H04B 1/40; H04B 15/02; H04B 1/0053; H04B 17/00; H04B 17/10; H04B 17/101; G01R 27/02
See application file for complete search history.

(56) References Cited

U.S. PATENT DOCUMENTS

| 6,822,433 B1 | 11/2004 | Gilbert |
| 2008/0266021 A1 | 10/2008 | Van Bezooijen et al. |
| 2010/0019853 A1* | 1/2010 | Nauta ................ H03F 3/45085 330/310 |

(Continued)

FOREIGN PATENT DOCUMENTS

| EP | 1761113 A2 | 3/2007 |
| WO | 2009090035 A1 | 7/2009 |

OTHER PUBLICATIONS

Anonymous: "AD8302 datasheet: RF/IF Gain and Phase Detector", 2002, pp. 1-24, XP002713069, Retrieved from the Internet: URL:http://www.analog.com/static/imported-files/data_sheets/AD8302.pdf, [retrieved-on Sep. 9, 2013].

(Continued)

*Primary Examiner* — Jean B Corrielus
(74) *Attorney, Agent, or Firm* — Smith Risley Tempel Blaha LLC (57) ABSTRACT

An impedance measurement system (IMS) is provided that comprises an RSSI chain (RSSI), a limiter RSSI chain (LIMRSSI) and a limiter chain (LIM). The RSSI chain and the limiter RSSI chain are connected to a subtraction circuit (SC) and the limiter RSSI chain and the limiter chain are connected to a phase detector (PD). Further, a mobile communication device is provided that comprises the impedance measurement system in an adaptive impedance control system.

12 Claims, 5 Drawing Sheets

(56) References Cited

U.S. PATENT DOCUMENTS

2012/0256689 A1    10/2012   El Kaamouchi et al.
2013/0225088 A1*   8/2013    Anderson ................ H04B 1/18
                                                         455/62
2014/0009362 A1*   1/2014    Ho ........................... H04B 1/04
                                                         343/861

OTHER PUBLICATIONS

Cowles: "Accurate gain/phase measurement at radio frequencies up to 2.5 GHz", Analog Dialogue, vol. 35, No. 5, Jan. 1, 2001, p. 1, XP55078862, ISSN: 0161-3626.

International Search Report and Written Opinion—PCT/EP2013/050498—ISA/EPO—Oct. 9, 2013.

Ramos J. et al., "Design of limiting/logarithmic amplifier for wideband bioimpedance measuring devices", Biomedical Circuits and Systems Conference (BIOCAS), 2010 IEEE, IEEE, Nov. 3, 2010, pp. 290-293, XP031899754, DOI : 10.1109/BIOCAS.2010.5709628, ISBN: 978-1-4244-7269-7.

Yang Y. et al., "Design and preliminary evaluation of a portable device for the measurement of bioimpedance spectroscopy; Design and preliminary evaluation of a portable device", Physiological Measurement, Institute of Physics Publishing, Bristol, GB, vol. 27, No. 12, Dec. 1, 2006, pp. 1293-1310, XP020105705, ISSN: 0967-3334.

* cited by examiner

IMPEDANCE MEASUREMENT SYSTEM AND MOBILE COMMUNICATION DEVICE COMPRISING AN IMPEDANCE MEASUREMENT SYSTEM

The present invention refers to impedance measurement systems, e.g. for antenna tuners in mobile communication devices, and to such mobile communication devices.

BACKGROUND

Modern mobile communication devices often comprise an antenna, e.g. a Planar Inverted F Antennas (PIFA), that is susceptible to detuning due to changes in the antenna's environment. To improve the radiation characteristics of such an antenna the mobile communication device can comprise an adaptive impedance control system. The impedance control system can comprise an impedance measurement system to measure the actual impedance of the signal path terminated with the antenna.

U.S. Pat. No. 6,822,433 B1 shows a gain and phase detector circuit that can be utilized as an impedance measurement system. The detector circuit has an output for providing a ratiometric gain measurement and an output for providing phase information. Each output is connected to two amplifier chains.

SUMMARY OF THE INVENTION

It is an object of the present invention to provide a further impedance measurement system and a mobile communication device having such an impedance measurement system.

The features described in the description below and in the figures can be individually combined to obtain an impedance measurement system that is highly optimized and specialized for the respective requirement.

The independent claims provide an impedance measurement system and a mobile communication device having an impedance measurement system respectively. Dependent claims provide preferred embodiments of the invention.

An impedance measurement system comprises an input network with a first, second, and a third primary signal input. This input network further comprises a first and a second intermediate signal output. The impedance measurement system further comprises an RSSI chain. The RSSI chain is coupled to the first intermediate signal output and has an RSSI output. The measurement system further comprises a limiter RSSI chain coupled to the second intermediate signal output. The limiter RSSI chain has a limiter output and an RSSI output. The measurement system further comprises a limiter chain coupled to the input network. The limiter chain has a limiter output. The measurement system further comprises a subtraction circuit coupled to the RSSI output of the RSSI chain and to the RSSI output of the limiter RSSI chain. The measurement system further comprises a phase detector coupled to the limiter output of the limiter RSSI chain and to the limiter output of the limiter chain.

The RSSI chain, the limiter RSSI chain and the limiter chain are chains of amplifiers. The RSSI chain (RSSI=received signal strength indicator) provides at its RSSI output a signal that is mainly proportional to a logarithm of the strength of a signal fed into the input of the RSSI chain.

The RSSI output of the limiter RSSI chain also provides a signal that is mainly proportional to a logarithm of the strength of a signal fed into the signal input of the limiter RSSI chain. The limiter output of the limiter RSSI chain mainly provides a square wave signal that contains phase information of the input signal fed into the signal input of the limiter RSSI chain. The limiter output of the limiter chain also provides a square wave signal carrying phase information about an input signal fed into the signal input of the limiter chain.

Each chain can comprise a cascade of amplifiers or limiter amplifiers. In the RSSI chain and in the limiter RSSI chain each of the cascade's amplifiers can contribute to the RSSI sum as the measure for the logarithmic output signal. The signal at the output of the amplifier cascades of the limiter RSSI chain and of the limiter chain can be used to derive phase information.

It is possible that all three chains have a similar construction. The RSSI chain and the limiter RSSI chain provide the logarithmic information and the limiter RSSI chain and the limiter chain provide phase information.

The subtraction circuit can provide a difference signal, i.e. a signal mainly proportional to the difference between an output signal of the RSSI output of the RSSI chain and an output signal of the RSSI output of the limiter RSSI chain.

The phase detector can provide the phase difference or a measure for the phase difference between an output signal of the limiter output of the limiter RSSI chain and an output signal of the limiter output of the limiter chain.

It is possible that only the RSSI chain and the limiter RSSI chain provide a signal mainly proportional to the logarithm of the respective input signal. The limiter chain, then, does not provide logarithmic information.

The subtraction circuit can comprise an addition circuit that is fed with an inverted output signal of either the RSSI chain or the limiter RSSI chain.

The phase detector can be a conventional phase detector for square wave signals and may comprise a mixer.

It is possible that the limiter chain is connected to the first intermediate signal output or to the second intermediate signal output of the input network.

In one embodiment, however, the input network further comprises a third intermediate signal output and the limiter chain is coupled to the input network via the third intermediate signal output.

Thus, the phase detector can provide the phase difference between the first and the second intermediate signal, between the second and the third intermediate signal, or between the first and the third intermediate signal.

In one embodiment the first primary signal input is designated for receiving a first electric potential $V_1$. The second primary signal input is designated for receiving a second electric potential $V_2$. The third primary signal input is designated for receiving a third electric potential $V_0$.

The first and the second intermediate signal outputs are designated to provide differential voltages between the three electric potentials. The voltages can be selected from $V_{10}=V_1-V_0$, $V_{12}=V_1-V_2$, $V_{20}=V_2-V_0$, or the respective negative voltages $-V_{10}$, $-V_{12}$, or $-V_{20}$.

If the input network has a third intermediate signal output then the third intermediate signal output is also designated to provide a voltage from the above selection.

Figure 2:
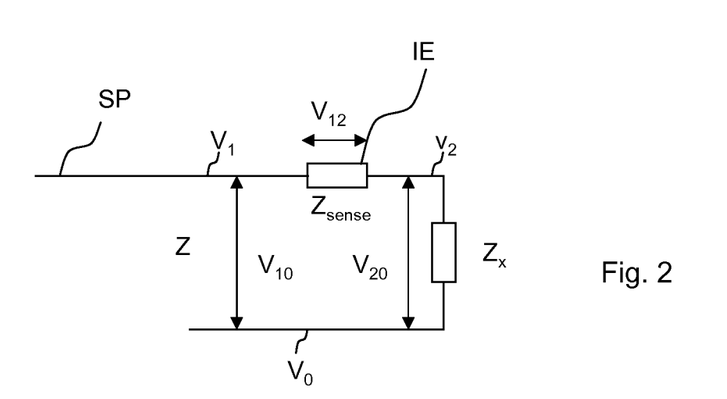
FIG. 2 shows an equivalent circuit diagram of the signal path comprising an unknown load impedance $Z_X$ and a sensing impedance $Z_{sense}$.
Figure 3:
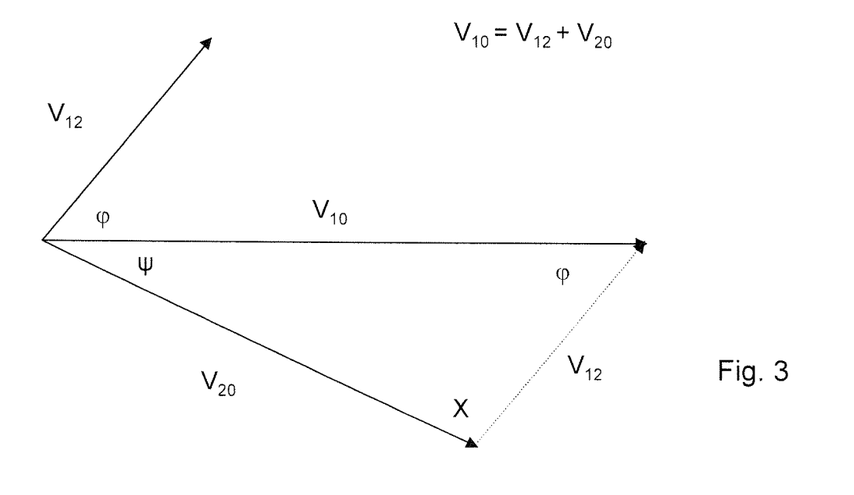
FIG. 3 shows fundamental correlations between the different input signals and their respective phase differences.

The meaning of the electrical potentials $V_1$, $V_2$, and $V_0$ in the meaning of the respective voltages $V_{10}$, $V_{12}$, and $V_{20}$ can be obtained from FIGS. 2 and 3. FIG. 2 shows schematically a segment of a signal path SP in which RF signals can propagate. The signal path SP may be connected to an antenna having a variable load impedance. Such an antenna and its load impedance is represented by an impedance Z. Further, the signal path SP comprises a sensing impedance $Z_{sense}$ which may be an inductive element IE. $V_{20}$ denotes the voltage drop of the load impedance $Z_x$. $V_{12}$ denotes the voltage drop across impedance $Z_{sense}$. $V_{10}$ is the sum of the voltages $V_{20}$ and $V_{12}$: $V_{10}=V_{20}+V_{12}$. Thus, the impedance Z of the signal path SP equals the (unknown) load impedance $Z_x$ plus the sensing impedance $Z_{sense}$ which may be a known impedance: $Z=Z_x+Z_{sense}$. From FIG. 2 it is clear that the impedance of the signal path Z is: $Z=Z_{sense} V_{10}/V_{12}$ where $V_{10}$ and $V_{12}$ are voltages representable as complex numbers.

It is clear that the situation shown in FIG. 2 can be described with parameters other than voltages $V_{10}$, $V_{12}$, and $V_{20}$. The central idea of the present invention does not depend on details of parameters used as signal inputs for the input network. Other parameters, e.g. current information, are also possible.

Thus, the problem of deriving the unknown impedance Z in the impedance measurement system can be reduced to determining the ratio $V_{10}/V_{12}$. $V_{10}$ may be written as $V_{10}=|V_{10}| \exp(j\omega t)$. Then, $V_{12}$ may be written as $V_{12}=|V_{12}| \exp((j\omega t)+\phi)$. I.e. $V_{10}$ and $V_{12}$ are signals of the same frequency with a phase difference of $\phi$ between $V_{10}$ and $V_{12}$. Accordingly, the ratio $V_{10}/V_{12}$ can be written as $V_{10}/V_{12}=|V_{10}|/|V_{12}| \exp(j\phi)$. The correlations between $V_{10}$, $V_{12}$, and $V_{20}$ are drawn in the complex plane view in FIG. 3.

Thus, the problem of deriving the ratio $V_{10}/V_{12}$ can be reduced to derive the ratio of the absolute values $|V_{10}|/|V_{12}|$ and by obtaining a measure for the phase difference $\phi$.

In one embodiment the subtraction circuit is designated to provide a measure proportional to log $(|V_x|/|V_y|)$. The phase detector is designated to provide a measure for phase difference. $V_x$ and $V_y$ are selected from $V_{10}$, $V_{12}$, $V_{20}$, $-V_{10}$, $-V_{12}$, $-V_{20}$. The phase difference is selected from the phase differences between the intermediate signals or their negative values $V_{10}$, $V_{12}$, $V_{20}$, $-V_{10}$, $-V_{12}$, and $-V_{20}$.

In one embodiment the impedance measurement system comprises a first switching network coupled between the input network and the chains and a second switching network coupled between the chains and the subtraction circuit. The first and the second switching network can be used for chopping.

It is possible that signals from the RSSI outputs contain an offset term. When the respective chains are identical then this offset could be removed when the signals are subtracted in the subtraction circuit. When, however, these offsets are not exactly identical, their difference will remain after the subtraction. Then, chopping can be used in the amplifier circuits to remove such offsets. Input signals of the RSSI chain and of the limiter RSSI chain are swapped in a second measurement period relative to a first measurement period. Any differences in offsets of the two chains will result in an error after subtraction of same magnitudes in both periods but opposite polarity. When these two successive results are added and divided by two, i.e. when the average value is determined, then the offset between the two channels is cancelled.

In one embodiment the number of chains is 3. The inputs of the three chains are connected via the first switching network to the primary signal inputs. The outputs of a first chain and of a second chain are connected via the second switching network to a level ratio detection circuit. The outputs of the second chain and of a third chain are connected to a phase detector. Then, both switching networks can be used for chopping. Switching sequences can be considered where various measurements can be performed in a specific order by proper control of the switches.

In one embodiment the subtraction circuit comprises a switched capacitor circuit and an OpAmp circuit.

In one embodiment the OpAmp circuit is provided for supporting chopping, averaging and amplification. That is, the OpAmp circuit comprises circuit elements that allow these operations.

Such a subtraction circuit also establishes a solution where averaging is done in the analogue domain. Instead of switches for swapping an OpAmp circuit is utilized to perform the operations of taking two samples of two successive measurement periods followed by a period that takes the average value and amplifies the average value to an output signal.

In one embodiment the impedance measurement system further comprises an expansion circuit designated to expand the logarithmic signal of the subtraction circuit. Expansion can take place to the linear regime, for instance. The expansion circuit is coupled to the subtraction circuit.

It is possible to provide an AD (analoge/digital) converter to convert the output of the subtraction circuit into the digital domain for further processing. However, the logarithmic compression caused by the logarithmic operation of the chains can create an accuracy problem arising at the A/D conversion operation.

The following was found: The subtraction circuit can provide a measure proportional to log $(|V_x|/|V_y|)$ as described above. The output can, for instance, be c log $(|V_x|/|V_y|)$.

Then the output of the subtraction circuit, possibly after amplification, can be fed into the expansion circuit that may comprise a bipolar differential stage. The bipolar differential stage can comprise two transistors where the ratio of the collector currents depends on the differential input voltage according to $I_{c1}/I_{c2}=\exp(V_{IN}/V_T)$. Then the ratio between the collector currents $I_{c1}/I_{c2}$ can be $|Vx|/|Vy|$ with $V_x$ and $V_y$ being the respective Voltages selected from $V_{10}$, $V_{20}$, $V_{12}$, $-V_{10}$, $-V_{20}$, $-V_{12}$. $V_T$ can be the thermal voltage $k_B T/q$ where $k_B$ is the Boltzmann's constant, T is the absolute temperature in Kelvin and q is the electron charge.

This is the case when the RSSI has a PTAT-slope (PTAT=proportional to absolute temperature) and the subtracted output signals are amplified with a certain specific value.

Thus, it is possible to accurately convert the ratio of two intermediate signals linearly into a ratio of the collector currents. So the ratio $|V_{10}|/|V_{12}|$ can, for instance, be obtained with a high accuracy.

For that, the impedance measurement system comprises a bipolar differential stage in the expansion circuit.

In one embodiment the impedance measurement system further comprises an A/D converter designated to convert analogue output signals into the digital domain.

Further, a mobile communication device is provided that comprises an adaptive impedance control system with one of the above described impedance measurement systems.

Examples of impedance measurement systems and the basic working principles are shown in the schematic figures.

DETAILED DESCRIPTION

Figure 1:
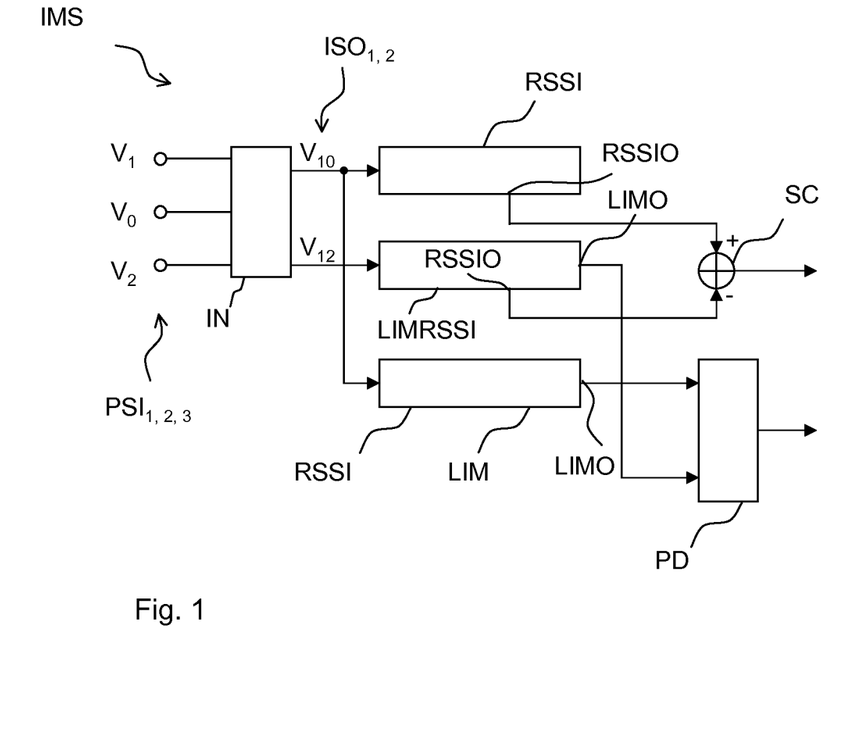
FIG. 1 shows the basic working principle of the impedance measurement system.

FIG. 1 shows an embodiment of the impedance measurement system IMS comprising an RSSI chain RSSI, a limiter RSSI chain LIMRSSI, and a limiter chain LIM. The three chains are connected to an input network IN which has a first primary signal input $PSI_1$, a second primary signal input $PSI_2$ and a third primary signal input $PSI_3$. The input network IN further comprises a first intermediate signal output $ISO_1$ and a second intermediate signal output $ISO_2$.

Via the first primary signal input $PSI_1$ a first electrical potential $V_1$ can be applied to the input network IN. Correspondingly via the second and the third primary signal input $PSI_{2,3}$ electrical potentials $V_2$, $V_0$ can be applied. In the embodiment shown in FIG. 1 the first intermediate signal output $ISO_1$ is coupled to the RSSI chain RSSI and to the limiter chain LIM. The second intermediate signal output $ISO_2$ is connected to the limiter RSSI chain LIMRSSI. The RSSI chain RSSI has an RSSI output RSSIO. The limiter RSSI chain also has an RSSI output RSSSIO. Those two RSSI outputs are coupled to the two signal inputs of the subtraction circuit SC. At the RSSI outputs RSSIO the RSSI chain and the limiter RSSI chain LIMRSSI provide a signal that is mainly proportional to a logarithm of the first $ISO_1$ and second $ISO_2$ intermediate signal respectively. The subtraction circuit SC provides the difference between the two signals which is mainly proportional to $c \log (V_{10}/V_{12})$.

Further, the limiter RSSI chain LIMRSSI has a limiter output LIMO and the limiter chain LIM has a limiter output LIMO. Those limiter outputs are connected to the phase detector PD. The signals provided at the limiter outputs LIMO could be square wave signals with a phase difference and the phase detector provides a measure for the phase difference at its output.

The embodiment shown in FIG. 1 uses the signal strengths of signals $V_{10}$ and $V_{12}$ and the phase difference between $V_{10}$ and $V_{12}$. However, other signal combinations are also possible to derive impedance information.

The intermediate signal outputs $ISO_{1,2}$ provide a voltage, i.e. an electric potential difference. For the sake of simplicity, the signal lines shown in the present drawings are a schematic representation of the physical signal lines which may comprise more than one single signal conductor for providing a voltage.

FIG. 2 schematically shows a signal path SP in which radio frequency signals may propagate. A potentially variable load impedance is denoted as $Z_x$. Further, the signal path SP comprises a sensing element $Z_{sense}$ needed for determining phase information. The sensing impedance $Z_{sense}$ could be established by an inductive element IE. $V_{10}$, $V_{20}$, and $V_{12}$ could be the voltages, i.e. the potential differences between the potentials $V_1$, $V_2$, and $V_0$ respectively.

In the circuit shown in FIG. 2 $V_{10}$ equals the sum: $V_{10} = V_{12} + V_{20}$.

FIG. 3 shows the correlations between the input signals $V_{10}$, $V_{20}$, and $V_{12}$. $V_{12}$ could be the voltage drop across the sensing element $Z_{sense}$, which may be an inductive element. $V_{10}$ could be the voltage between the input of the signal path and the ground potential. $V_{20}$ could be the voltage drop across the unknown load impedance $Z_x$. Then, $V_{10}$ is the sum of voltages $V_{12}$ and $V_{20}$. Accordingly, the three voltages establish a triangle defined by the length of the vectors or the respective angles. Assuming that the rules of Euclidean geometry are valid, the cosine of each angle is determined by the ratios of the respective side length of the triangle.

Figure 4:
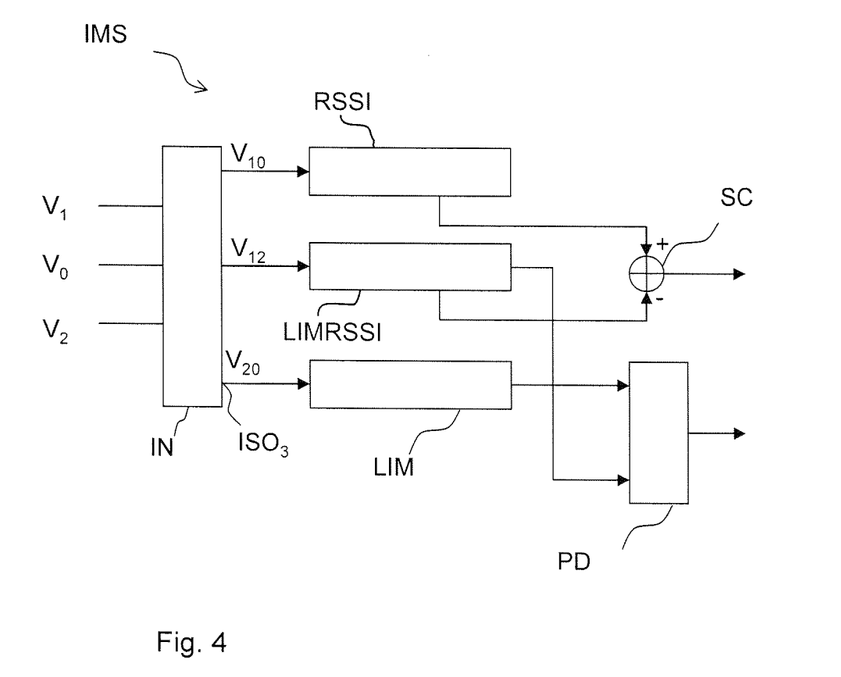
FIG. 4 shows an embodiment of the impedance measurement system with an input network having three intermediate signal outputs.

FIG. 4 shows an embodiment of the impedance measurement system IMS where the input network IN comprises a third intermediate signal output $ISO_2$ providing a third intermediate signal $V_{20}$. The third intermediate signal output $ISO_2$ is connected to the limiter chain LIM. Thus, the phase detector PD determines the phase difference between signal $V_{12}$ and $V_{20}$. The subtraction circuit SC, however, determines the logarithmic ratio of the levels of signals $V_{10}$ and $V_{12}$ according to FIG. 1.

Figure 5:
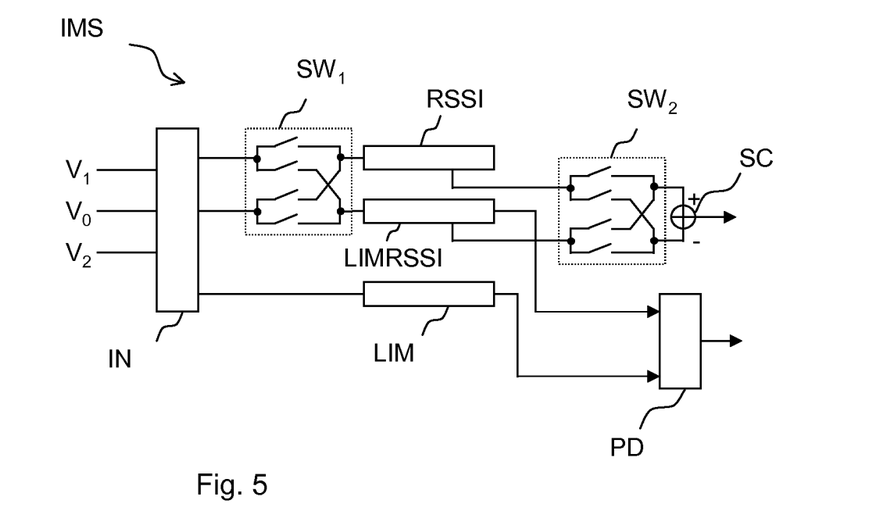
FIG. 5 shows an embodiment of the impedance measurement system with two switching networks.

FIG. 5 shows an embodiment of the impedance measurement system IMS where a first switching network SW1 is connected between the input network IN on one hand and the RSSI chain RSSI and the limiter RSSI chain LIMRSSI on the other hand. Further, a second switching network SW2 is connected between the two chains RSSI, LIMRSSI, and the subtraction circuit SC. With the two switching networks SW1 and SW2 chopping can be performed easily to remove offsets that may arise from a difference in the physical realization of the RSSI chain RSSI and the limiter RSSI chain LIMRSSI. To perform chopping the input signals of the two chains are swapped for a second measurement period after a first measurement period. Differences in offsets of the two chains usually result in an error after subtraction that has the same magnitude in both phases but opposite polarity. When these two successive measurement results are added and divided by two, e.g. by an averaging circuit, the respective offsets are cancelled. For that each switching network SW1, SW2 comprises four mainly parallel segments which can be switched by four switches per each switching network. The first intermediate signal output can be connected to the RSSI chain RSSI or to the limiter RSSI chain LIMRSSI. Accordingly, the second intermediate signal output can be connected to the RSSI chain RSSI or to the limiter RSSI chain LIMRSSI. Correspondingly the RSSI outputs of the RSSI chain and the limiter RSSI chain RSSI, LIMRSSI can both be connected to the positive signal input of the subtraction circuit and to the negative input of the subtraction circuit SC. Thus, two measurements in two successive measurement periods can be performed while in the second measurement period the chains are swapped.

Other switching networks for chopping are also possible.

Figure 6:
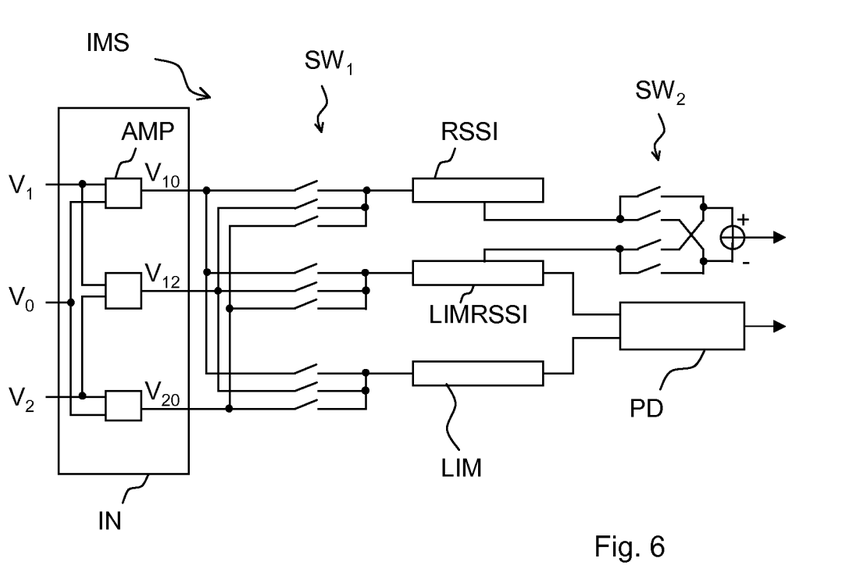
FIG. 6 shows an embodiment of the impedance measurement system with amplifiers in the input network.

FIG. 6 shows an embodiment of the impedance measurement system IMS with a more complex first switching network SW1. The first switching network SW1 of the embodiment shown in FIG. 6 comprises three parallel segments provided for each chain. Thus, each of the three intermediate signal output can easily be connected to each of the three chains.

Apart from swapping the first switching network SW1 allows to determine the phase difference between each of the three intermediate output signals and to determine the logarithmic ratio of each of the three intermediate signals.

Further, the input network IN comprises amplifiers AMP for pre-amplifying each intermediate signal. As a result of the pre-amplification via the amplifiers AMP it is established that the three chains work in the correct dynamic RSSI range in which a first of the amplifiers of the chain works linear or close to linear and a last of the amplifiers work fully overdriven or almost fully overdriven.

The embodiment of the impedance measurement system IMS shown in FIGS. 5 and 6 provide switching networks to perform chopping in the analogue domain which may be preferred because logarithmic compression may lead to errors during a A/D conversion step. However, the output signal of the subtraction circuit and of the phase detector can be fed into a respective A/D converter to provide digital output for further processing an integrated circuit.

Figure 7:
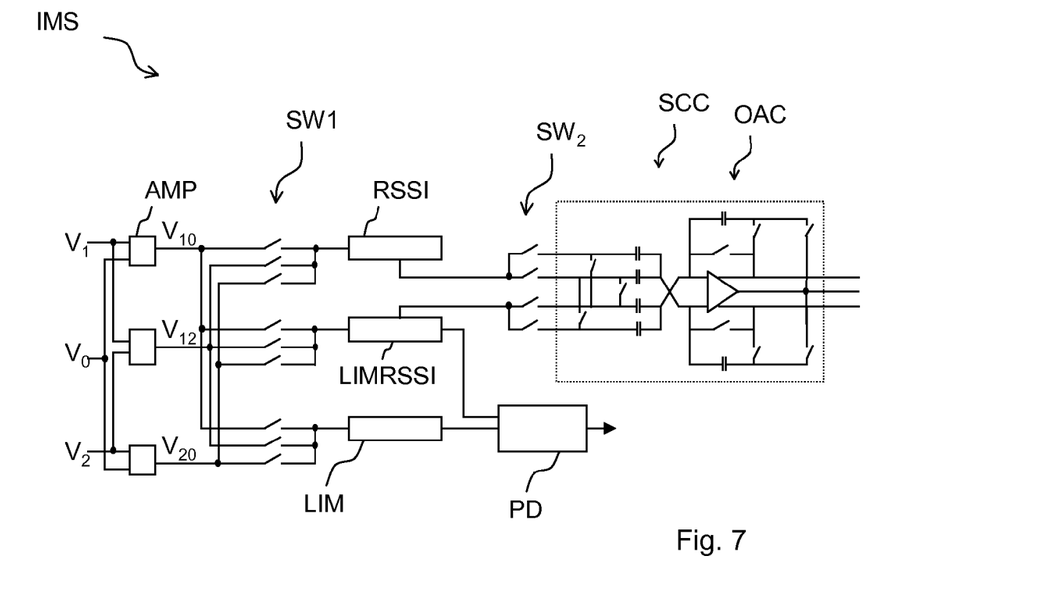
FIG. 7 shows an embodiment of the impedance measurement system where the subtraction circuit comprises a switched capacitor circuit and an OpAmp.

FIG. 7 shows an embodiment of the impedance measurement system IMS comprising a switched capacitor circuit SCC and an OpAmp circuit OAC (OpAmp=operational amplifier). With such circuits in the subtraction circuit SU averaging and amplification can be performed in the analogue domain. An OpAmp circuit OAC comprising an operational amplifier performs the operations of taking two samples of two successive phases followed by a phase that takes the average value and amplifies this to an output signal.

Performing a first period of measurement, performing a second period of measurement and determining the average value with only one switched capacitor circuit takes more time because the switched capacitor circuit misses two new RSSI output values of the RSSI chain RSSI and of the limiter RSSI chain LIMRSSI. When the averaging and amplification is performed, the circuit may not look at its inputs. It is possible that during the first two phases, only the input level at the moment of the end of the period is taken.

Figure 8:
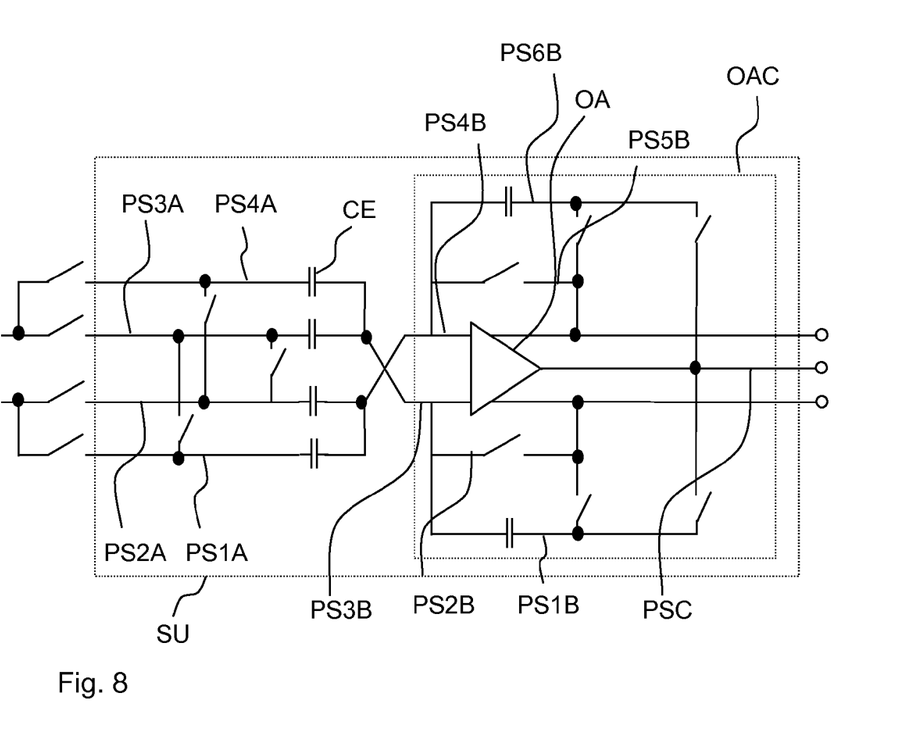
FIG. 8 shows an enlarged view of the subtraction circuit of FIG. 7.

FIG. 8 shows an enlarged view of the subtraction circuit SU and the switched capacitor circuit SCC shown in FIG. 7. The subtraction circuit comprises four parallel segments PS1A, PS2A, PS3A, and PS4A. Via those four parallel segments and the corresponding switches each RSSI output of the RSSI chain RSSI and the limiter RSSI chain LIMRSSI can be connected to the inputs of the operational amplifier OA. Each of the four parallel segments comprise a capacitive element CE for performing an averaging step.

The left four branches PS1A to PS4A can conduct four samples of the input signals (two for $V_X$, two for $V_Y$). Stored charge is averaged and transported to the capacitors of PS1B and PS6B.

The four capacitors CE first sample the input signals, then two successive chopped samples are averaged and finally, it is transported to the PSB capacitors. Because of a capacitance value ratio, there is an amplification realized at the OpAmp output.

The OpAmp circuit OAC comprises six parallel segments PS1B, PS2B, PS3B, PS4B, PS5B, and PS6B. In the first and in the sixth parallel segment of the OpAmp circuit OAC a capacitive element is connected. Further, the OpAmp circuit OAC comprises a center parallel segment PSC that may be connected with the common mode output voltage of the OpAmp circuit OAC. The switches and the capacitors in connection with the operational amplifier OA of the OpAmp circuit OAC allow averaging and amplification in the analogue domain.

Figure 9:
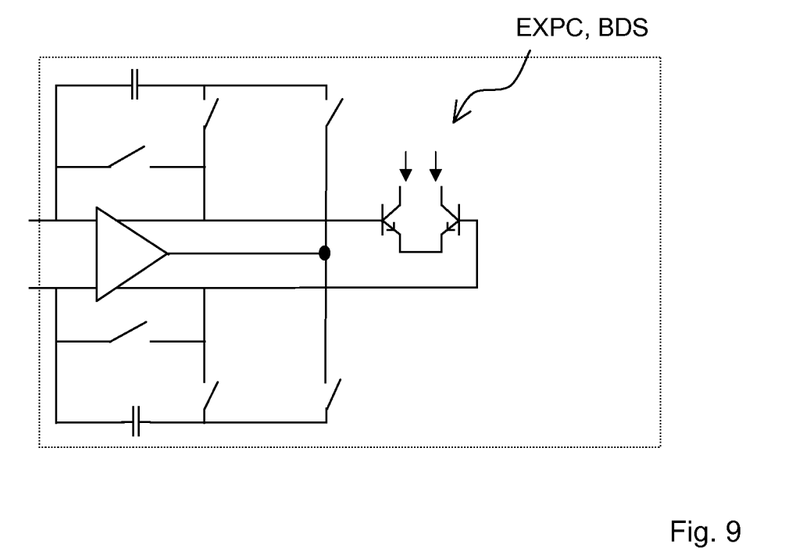
FIG. 9 shows an embodiment of an expansion circuit with a bipolar differential stage.

FIG. 9 shows an embodiment of an expansion circuit EXPC that can be connected to the OpAmp circuit OAC shown in FIG. 8.

The expansion circuit EXPC comprises a bipolar differential stage BDS that can expand the logarithmic ratio into the linear regime as the ratio of the collector currents has an exponential behavior: $I_{C1}/I_{C2}=\exp(V_{IN}/V_T)$. When dimensioned properly, $I_{C1}/I_{C2}$ can equal $|V_{10}|/|V_{12}|$ where $V_T$ is the thermal voltage $k_B T$ divided by q.

Figure 10:
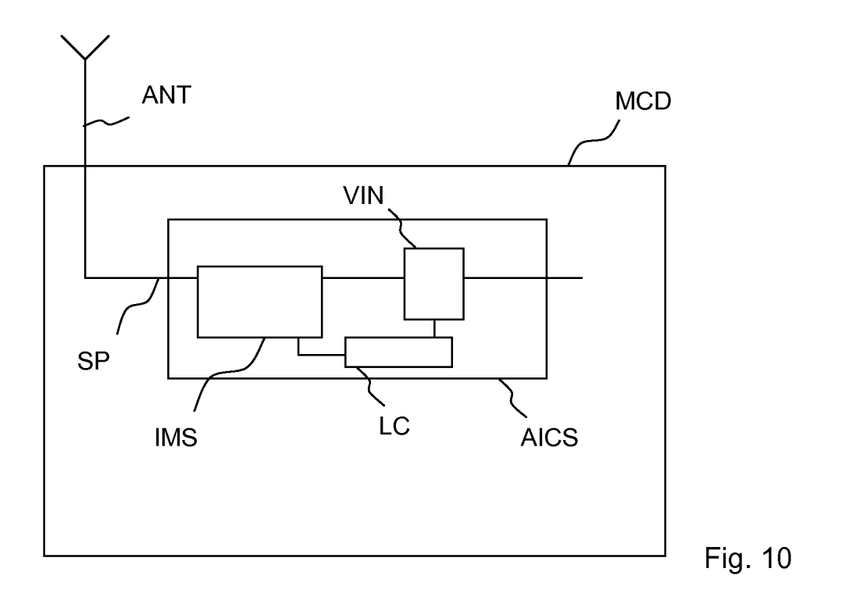
FIG. 10 shows a mobile communication device comprising an impedance measurement system in an adaptive impedance control system.

FIG. 10 shows a mobile communication device MCD comprising an impedance measurement system IMS as described above in an adaptive impedance control system AICS. The adaptive impedance control system AICS further comprises a logic circuit LC and a variable impedance network VIN. The adaptive impedance control system is connected or coupled to a signal path SP that is connected to an antenna ANT of the mobile communication device MCD. Thus, the actual impedance of the signal path SP can be determined via the impedance measurement system IMS and adapted to match a preferred impedance whereas the switchable impedance network VIN in the control loop controlled by the logic circuit LC.

The impedance measurement system and the mobile communication device are not limited to the above described embodiments. Further variants comprising further circuit elements such as RSSI or amplifier chains, switches and logic circuits for controlling switches are also comprised by the present invention.

LIST OF REFERENCE SYMBOLS

AICS: adaptive impedance control system
AMP: amplifier
ANT: antenna
BDS: bipolar differential stage
CE: capacitive element
EXPC: expansion circuit
IE: impedance element
IMS: impedance measurement system
IN: input network
$ISO_{1,2,3}$: first, second, third intermediate signal output
LC: logic circuit
LIMRSSI: limiter RSSI chain
LIM: limiter chain
LIMO: limiter output
MCD: mobile communication device
OA: OpAmp (operational amplifier)
OAC: OpAmp circuit
PD: phase detector
PS1A, PS2A, PS3A, PS4A: parallel segments of the second switching network SW2
PS1B, PS2B, PS3B, PS4B, PS5B, PS6B, PSC: parallel segments of the OpAmp circuit OAC
$PSI_{1,2,3}$: first, second, third primary signal input
RSSI: RSSI chain
RSSIO: RSSI output
SC: subtraction circuit
SCC: switched capacitor circuit
Z: sum: $Z_{sense}+Z_x$
$Z_{sense}$: sensing impedance
$Z_x$: unknown load impedance
SP: signal path
SW1, SW2: first, second switching network
$V_{1,2,0}$: first, second, third primary input signal
$V_{10}, V_{20}, V_{12}$: first, second, third secondary signal
VIN: variable impedance network
X: phase difference between $V_{12}$ and $V_{20}$
Φ: phase difference between $V_{10}$ and $V_{12}$
Ψ: phase difference between $V_{10}$ and $V_{20}$

The invention claimed is:
1. An impedance measurement system, comprising;
an input network with first, second, and third primary signal inputs and with first and second intermediate signal outputs;

a received signal strength indicator (RSSI) chain coupled to the first intermediate signal output, the RSSI chain having an RSSI output;

a limiter RSSI chain coupled to the second intermediate signal output, the limiter RSSI chain having a limiter output and an RSSI output;

a limiter chain coupled to the input network, the limiter chain having a limiter output;

a subtraction circuit coupled to the RSSI output of the RSSI chain and to the RSSI output of the limiter RSSI chain; and a phase detector coupled to the limiter output of the limiter RSSI chain and to the limiter output of the limiter chain.

2. The impedance measurement system of claim 1, wherein:

the input network comprises a third intermediate signal output; and the limiter chain is coupled to the input network via the third intermediate signal output.

3. The impedance measurement system of claim 1, wherein:

the first primary signal input is designated for receiving a first potential $V_1$;

the second primary signal input is designated for receiving a second potential $V_2$;

the third primary signal input is designated for receiving a third potential $V_0$; and the first and second intermediate signal outputs are designated to provide voltages selected from $V_{10}=V_1-V_0$, $V_{12}=V_1-V_2$, $V_{20}=V_2-V_0$, $-V_{10}$, $-V_{12}$, $-V_{20}$.

4. The impedance measurement system of claim 3, wherein:

the subtraction circuit is designated to provide a measure proportional to $\log(|V_x|/|V_y|)$;

the phase detector is designated to provide a measure for a phase difference;

$V_x$ and $V_y$ are selected from $V_{10}$, $V_{12}$, $V_{20}$, $-V_{10}$, $-V_{12}$, $-V_{20}$; and the phase difference is selected from the phase differences between the intermediate signals selected from $V_{10}$, $V_{12}$, $V_{20}$, $-V_{10}$, $-V_{12}$, $-V_{20}$.

5. The impedance measurement system of claim 1, further comprising:

a first switching network coupled between the input network and at least one of the RSSI chain, limiter RSSI chain, and limiter chain; and a second switching network coupled between the RSSI chain and the subtraction circuit and between the limiter RSSI chain and the subtraction circuit, where the first and second switching networks are designated for chopping.

6. The impedance measurement system of claim 5, wherein:

the inputs of the at least one of the RSSI chain, limiter RSSI chain and limiter chain are connected via the first switching network to the first, second and third primary signal inputs and receive first and second intermediate signals selected from $V_{10}$, $V_{20}$, $V_{12}$, $-V_{10}$, $-V_{20}$, $-V_{12}$;

the outputs of the RSSI chain and the limiter RSSI chain are connected via the second switching network to a level ratio detection circuit;

the outputs of the limiter RSSI chain and the limiter chain are connected to the phase detector; and both switching networks are used for chopping.

7. The impedance measurement system of claim 1, wherein the subtraction circuit comprises a switched capacitor circuit and an OpAmp circuit.

8. The impedance measurement system of claim 7, wherein the OpAmp circuit is provided for supporting chopping, averaging and amplification.

9. The impedance measurement system of claim 1, further comprising an expansion circuit designated to expand a logarithmic signal of the subtraction circuit to a linear region, the expansion circuit being coupled to the subtraction circuit.

10. The impedance measurement system of claim 9, wherein the expansion circuit comprises a bipolar differential stage.

11. The impedance measurement system of claim 1, further comprising an analog-to-digital converter designated to convert analog output signals into the digital domain.

12. A mobile communication device having an adaptive impedance control system with an impedance measurement system comprising:

an input network with first, second, and third primary signal inputs and with first and second intermediate signal outputs;

a received signal strength indicator (RSSI) chain coupled to the first intermediate signal output, the RSSI chain having an RSSI output;

a limiter RSSI chain coupled to the second intermediate signal output, the limiter RSSI chain having a limiter output and an RSSI output;

a limiter chain coupled to the input network, the limiter chain having a limiter output;

a subtraction circuit coupled to the RSSI output of the RSSI chain and to the RSSI output of the limiter RSSI chain; and a phase detector coupled to the limiter output of the limiter RSSI chain and to the limiter output of the limiter chain.

* * * * *